United States Patent
Tao

(10) Patent No.: US 10,518,521 B2
(45) Date of Patent: Dec. 31, 2019

(54) SEPARATION APPARATUS AND SEPARATION METHOD FOR FLEXIBLE DISPLAY PANEL

(71) Applicant: Wuhan China Star Optoelectronics Semiconductor Display Technology Co., Ltd., Wuhan, Hubei (CN)

(72) Inventor: Qiang Tao, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 109 days.

(21) Appl. No.: 15/579,352

(22) PCT Filed: Nov. 22, 2017

(86) PCT No.: PCT/CN2017/112249
§ 371 (c)(1),
(2) Date: Dec. 4, 2017

(87) PCT Pub. No.: WO2019/080230
PCT Pub. Date: May 2, 2019

(65) Prior Publication Data
US 2019/0232634 A1   Aug. 1, 2019

(30) Foreign Application Priority Data
Oct. 23, 2017 (CN) .......................... 2017 1 0991583

(51) Int. Cl.
*B32B 43/00* (2006.01)
*H01L 51/00* (2006.01)

(52) U.S. Cl.
CPC ........ *B32B 43/006* (2013.01); *B32B 2457/20* (2013.01); *H01L 51/0097* (2013.01);
(Continued)

(58) Field of Classification Search
CPC ......... Y10T 156/1132; Y10T 156/1153; Y10T 156/1168; Y10T 156/1911;
(Continued)

(56) References Cited

U.S. PATENT DOCUMENTS 3,690,386 A * 9/1972 Magee .................. E02F 3/7618
172/821
6,478,919 B1 * 11/2002 Kawada .................. B29C 63/02
156/249

(Continued)

FOREIGN PATENT DOCUMENTS

CN 102886966 1/2013
CN 102983062 A 3/2013
(Continued)

OTHER PUBLICATIONS

Google Patents translation of KR 101458406B1, 2019. (Year: 2019).*

*Primary Examiner* — Mark A Osele
(74) *Attorney, Agent, or Firm* — Hemisphere Law, PLLC; Zhigang Ma

(57) ABSTRACT

The present application provides a separation apparatus for a flexible display panel, includes a support post, a power unit and a vacuum suction block; wherein the supporting post is used to support the separation apparatus on the relatively upper side of the rigid substrate to be separated; the vacuum suction block is in communication with the support post, and is used to suck and connect the rigid substrate to be separated; and one end of the power unit is connected to the support post, the other end is rotatably connected with the vacuum suction block, and is used for controlling the vacuum suction block and the rigid substrate to be separated together to be separated from the flexible display panel. The present application also provides a method for separating a flexible display panel.

16 Claims, 4 Drawing Sheets

(52) U.S. Cl.
CPC .......... *Y10S 156/93* (2013.01); *Y10S 156/941* (2013.01); *Y10T 156/1132* (2015.01); *Y10T 156/1137* (2015.01); *Y10T 156/1153* (2015.01); *Y10T 156/1168* (2015.01); *Y10T 156/1911* (2015.01); *Y10T 156/1944* (2015.01); *Y10T 156/1978* (2015.01)

(58) Field of Classification Search
CPC ......... Y10T 156/1944; Y10T 156/1978; Y10T 156/1989; Y10S 156/93; Y10S 156/941; B32B 43/006
See application file for complete search history.

(56) References Cited

U.S. PATENT DOCUMENTS

| | | | | |
|---|---|---|---|---|
| 6,503,130 | B2* | 1/2003 | Lim | ........................ B24B 37/34 |
| | | | | 156/716 |
| 8,360,129 | B2* | 1/2013 | Ebata | ..................... B65H 41/00 |
| | | | | 156/714 |
| 2004/0166653 | A1* | 8/2004 | Kerdiles | ................ G01N 19/04 |
| | | | | 438/458 |
| 2013/0020031 | A1* | 1/2013 | Fujita | .................... B32B 43/006 |
| | | | | 156/711 |
| 2013/0319620 | A1* | 12/2013 | Ho | .......................... H01L 21/56 |
| | | | | 156/714 |
| 2014/0332166 | A1* | 11/2014 | Honda | ............. H01L 21/67092 |
| | | | | 156/708 |
| 2018/0233385 | A1* | 8/2018 | Iwata | .................... B32B 43/006 |
| 2019/0165272 | A1* | 5/2019 | Kang | .................... H01L 51/003 |

FOREIGN PATENT DOCUMENTS

| | | | |
|---|---|---|---|
| CN | 203910868 | 10/2014 | |
| CN | 204666998 | 9/2015 | |
| CN | 105511130 A | 4/2016 | |
| CN | 106585067 A | 4/2017 | |
| JP | 2000-351459 A | 12/2000 | |
| JP | 2005116346 | 4/2005 | |
| KR | 101458406 B1 * | 11/2014 | ........... B32B 43/006 |

* cited by examiner

SEPARATION APPARATUS AND SEPARATION METHOD FOR FLEXIBLE DISPLAY PANEL

RELATED APPLICATIONS

The present application is a National Phase of International Application Number PCT/CN2017/112249, filed Nov. 22, 2017, and claims the priority of China Application 201710991583.2, filed Oct. 23, 2017.

FIELD OF THE DISCLOSURE

The disclosure relates to a display technical field, and more particularly to a separation apparatus and a separation method for a flexible display panel.

BACKGROUND

The flexible display panel is a display device formed on the basis of a flexible base material. As the flexible display panel with the advantages of curable, wide viewing angle, easy to carry and so on, therefore, in portable products and other applications have a broad application prospects and good market potential.

By bringing a series of advantages of the flexible display panel, it also has its own shortcomings, because the flexible substrate has issues of flexibility and thermal expansion and others, it has processing inconvenience to the display device, it is easy to sag the substrate, even folds or fractures, it is difficult to accurately perform the fabrication of the following process of layers of films. In order to solve the problem, the flexible substrate needs to be bonded to a rigid substrate such as a glass substrate, for supporting and fixing the flexible substrate to facilitate the formation of the thin film. After the layers of elements forming the display panel are fabricated on the flexible substrate, the rigid substrate is lifted-off from the flexible substrate through a lift-off process to complete the fabrication of the flexible display panel.

For the separation of the rigid substrate and the flexible substrate, a laser lift-off, LLO process is usually used to ablate the adhesive layer between the flexible substrate and the rigid substrate, wherein the rigid substrate is still bonded to the flexible substrate. After the LLO process, how to lift-off the rigid substrate from the flexible substrate, is a problem need to be solved. In the conventional technology, the blade is usually inserted between the bonding interface of the rigid substrate and the flexible substrate, and then the blade is moved so that the rigid substrate and the flexible substrate are completely separated. This method is relatively inefficient, and due to the use of blades, can easily lead to damage the rigid substrate and flexible substrate.

SUMMARY

In view of the insufficient of the conventional technology, the present invention provides a separation apparatus and a separation method for a flexible display panel, for separating a rigid substrate from a flexible substrate after a laser separating process, it can effectively prevent the rigid substrate and the flexible substrate from damaged during the separation process, and the work efficiency can be improved.

In order to achieve the above object, the present invention adopts the following technical scheme:

A separation apparatus for a flexible display panel, for lifting-off a rigid substrate and a flexible display panel bonded to each other, wherein the separation apparatus includes a support post, a power unit and a vacuum suction block; wherein the supporting post is used to support the separation apparatus on the relatively upper side of the rigid substrate to be separated; the vacuum suction block is in communication with the support post, and is used to suck and connect the rigid substrate to be separated; and one end of the power unit is connected to the support post, the other end is rotatably connected with the vacuum suction block, and is used for controlling the vacuum suction block and the rigid substrate to be separated together to be separated from the flexible display panel.

Wherein the power unit includes a power output device and a drive shaft; the drive shaft is extending along a first direction, the power output device is drivably connected to the drive shaft to drive the drive shaft to reciprocate motion in the first direction; the vacuum suction block is rotatably connected to the drive shaft; wherein the first direction forms an included angle between a normal direction of the rigid substrate to be separated.

Wherein the angle of the included angle is 5° to 30°.

Wherein the power output device is a cylinder, the power output device is connected to a first end of the drive shaft, the vacuum suction block is connected to a second end of the drive shaft.

Wherein the vacuum suction block is connected to the second end of the drive shaft by an universal joint.

Wherein the separation apparatus further includes: an air blowing unit, the air blowing unit is for blowing gas into a bonding interface between the flexible display panel and the rigid substrate.

Wherein the vacuum suction block is connected to a heating unit, the heating unit is for heating the rigid substrate through the vacuum suction block.

Wherein the vacuum suction block includes a suction nozzle, the suction nozzle is connected to an external vacuum suction apparatus through an air pipe, the air pipe is extended in the support post.

The present application provides a method for separating a flexible display panel, for separating a rigid substrate and a flexible display panel bonded to each other, wherein the separation method includes:

Providing a vacuum suction platform, sucking and fixing the flexible display panel to the vacuum suction platform by placing the flexible display panel toward the vacuum suction platform;

Ablating an adhesive layer between the flexible display panel and the rigid substrate by using a laser lifting-off process;

Providing a separation apparatus for the flexible display panel as described above, fixing the separation apparatus above the rigid substrate;

Controlling the vacuum suction block of the separation apparatus to suck and connect to the rigid substrate, wherein a position of the vacuum suction block sucked and connected is adjacent to an edge of the rigid substrate;

Controlling the power unit of the separation apparatus to pull the vacuum suction block, to make a bonding interface of the flexible display panel and the rigid substrate separated and forming an opening portion; and Controlling the power unit continually to pull the vacuum suction block, to make the opening portion extended until the rigid substrate completely lifted-off from the flexible display panel.

Wherein the separation method further including: when pulling the vacuum suction block, an air is blown into the bonding interface through the opening portion.

Wherein the speed of the power unit to pull the vacuum suction block is 0.1~0.3 mm/s.

Wherein the separation method further including: the separation method further including: when pulling the vacuum suction block, heating the rigid substrate through the conduction of the vacuum suction block.

Wherein a heating temperature to the vacuum suction block is 50° C. to 80° C.

Compared with the conventional technology, the embodiments of the present application provide a separation apparatus and a separation method for a flexible display panel, by sucking and connecting the edges of the upper surface of the rigid substrate, and applying the pulling force toward the center axis direction of the rigid substrate, so that the bonding interface between the flexible display panel and the rigid substrate forms the opening portions that gradually extends inwardly. Finally, the rigid substrate is lifted-off from the flexible display panel effectively and stably, thereby improving work efficiency. During the process of separation, the contact and fixing between the separation apparatus and the rigid substrate and the flexible substrate is achieved by vacuum suction, which avoids the rigid substrate and the flexible substrate from being damaged in the separation process by using sharp tools (such as blades).

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows. However, the present invention will not be limited to those embodiments.

It should also be noted that, in order to avoid obscuring the present invention due to unnecessary details, only structural and/or processing steps closely related to the arrangement according to the invention are shown in the accompanying drawings, other details of the present invention are less relevant.

Figure 1:
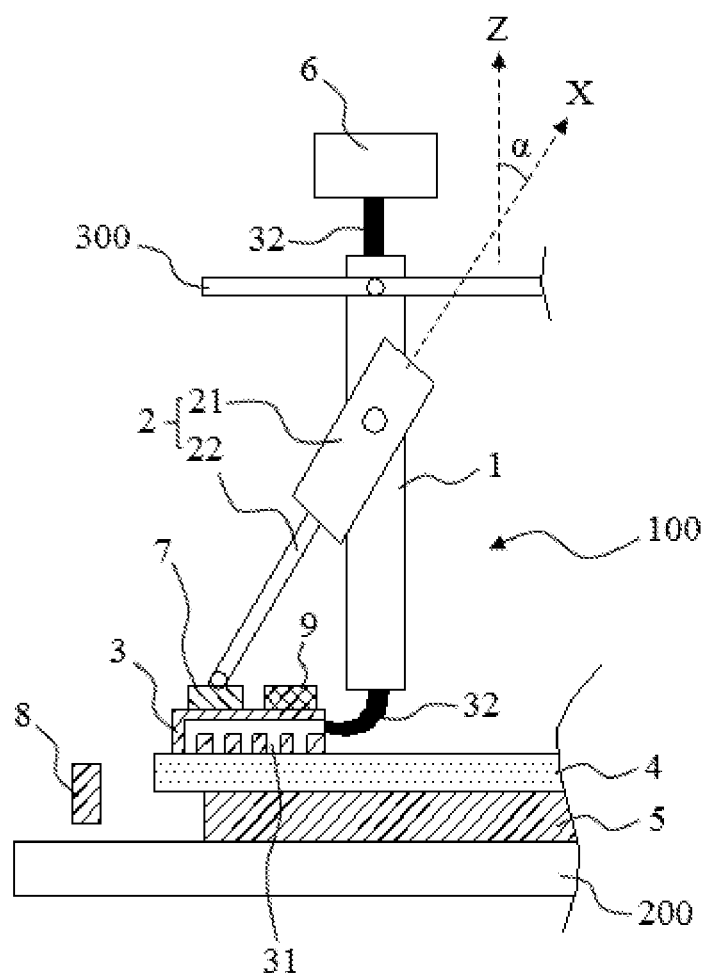
FIG. 1 is a schematic diagram of a separation apparatus of a flexible display panel according to an embodiment of the present invention, FIG. 1 also shows a vacuum suction platform for carrying and sucking to fix the flexible display panel.

The present embodiment first provides a separation apparatus for a flexible display panel, for lift-off the rigid substrate and the flexible display panel bonded to each other. As shown in FIG. 1, the separation apparatus 100 includes a support post 1, a power unit 2 and a vacuum suction block 3. The supporting post 1 is used to support the separation apparatus 100 on the relatively upper side of the rigid substrate 4 to be separated, the vacuum suction block 3 is in communication with the support post 1, and is used to suck and connect the rigid substrate 4 to be separated. One end of the power unit 2 is connected to the support post 1, the other end is rotatably connected with the vacuum suction block 3, and is used for controlling the vacuum suction block 3 and the rigid substrate 4 to be separated together to be separated from the flexible display panel 5.

Specifically, as shown in FIG. 1, the power unit 2 is connected to the support post 1, the power unit 2 includes a power output device 21 and a drive shaft 22, the drive shaft 22 is extending along a first direction 1 (the X direction shown in FIG. 1), the power output device 21 is drivably connected to the drive shaft 22 to drive the drive shaft 22 to reciprocate motion in the first direction. The vacuum suction block 3 is rotatably connected to the drive shaft 22, the vacuum suction block 3 is used for sucking and connecting the rigid substrate 4 to be separated.

In the present embodiment, as shown in FIG. 1, the vacuum suction block 3 is provided with a suction nozzle 31, the suction nozzle 31 is connected to an external vacuum suction apparatus 6 through an air pipe 32, when the vacuum suction block 3 is placed on the surface of the rigid substrate 4, the vacuum suction apparatus 6 is controlled to be evacuated by the air pipe 32, so that the suction nozzle 31 is attracted and connected to the rigid substrate 4. In the present embodiment, the air pipe 32 is fitted in the support post 1 to prevent the air pipe 32 32 from being dropped.

Wherein, referring to FIG. 1, the first direction forms an included angle α between the normal direction of the rigid substrate 4 to be separated (as the Z direction in FIG. 1). The angle of the included angle is preferably 5° to 30°.

In a specific application, as shown in FIG. 1, a vacuum suction platform 200 is first provided, and the flexible display panel 5 is sucked and fixed to the vacuum suction platform 200 toward the vacuum suction platform 200, wherein the rigid substrate 4 is relatively disposed on the flexible display panel 5. A fixing frame 300 is provided above the vacuum suction platform 200, the support post 1 is fixedly connected to the fixing frame 300, so that the support post 1 supports the separation apparatus 100 relatively above the rigid substrate to be separated 4. The power unit 2 may be connected to the support post 1 by screw fasteners. Wherein, after the required included angle α is set, the power unit 2 is fixed on the supporting post 1 by screw fasteners. In the embodiment, the support post 1 is disposed along the vertical direction (the normal direction Z of the rigid substrate 4).

Wherein, the flexible display panel 5 and the rigid substrate 4 are first subjected to a laser lifted-off process by using a laser lifted-off apparatus, to ablate the adhesive layer between the flexible display panel 5 and the rigid substrate 4.

By irradiating a laser beam from the top of the rigid substrate 4, the adhesive layer between the flexible display panel 5 and the rigid substrate 4 is ablated. After the adhesive layer is ablated, the flexible display panel 5 and the rigid substrate 4 are also bonded to each other, and the rigid substrate 4 is then lifted-off from the flexible display panel 5 by using the separation apparatus 100. Specifically, the separation apparatus 100 is fixedly connected to the fixed frame 300 through the support post 1, and then the vacuum suction block 3 is controlled to be sucked and connected to the upper surface of the rigid substrate 4, and the power unit 2 is controlled to pull the vacuum suction block 3 along the first direction, to separate the flexible display panel 5 from the bonding interface of the rigid substrate 4 to form an opening portion, and continue to pull the vacuum suction block 3 until the rigid substrate 4 is completely lifted-off from the flexible display panel 5.

In the present embodiment, as shown in FIG. 1, the power output device 21 is a cylinder, the power output device 21 is connected to a first end of the drive shaft 22, the vacuum suction block 3 is connected to a second end of the drive shaft 22. Specifically, the vacuum suction block 3 is connected to the second end of the drive shaft 22 by an universal joint 7, whereby, in the case where the movement direction of the drive shaft 22 is kept constant, as the rigid substrate 4 is lifted-off, the angle between the vacuum suction block 3 and the driving shaft 22 can be automatically adjusted by the connection of the universal joint 7, so as to avoid generating the bending stress to damage the rigid substrate 4.

Further, in the present embodiment, as shown in FIG. 1, the separation apparatus further includes an air blowing unit 8, the air blowing unit 8 is for blowing gas into the bonding interface between the flexible display panel 5 and the rigid substrate 4. When the rigid substrate 4 is sucked and listed-off by using the vacuum suction block 3, a gas is blown into the bonding interface by using the air blowing unit 8 to make a better and faster separation between the flexible display panel 5 and the rigid substrate 4.

Further, in the present embodiment, as shown in FIG. 1, the vacuum suction block 3 is connected to a heating unit 9, the heating unit 9 is for heating the rigid substrate 4 through the vacuum suction block 3. When the rigid substrate 4 is sucked and listed-off by using the vacuum suction block 3, due to the conduction of the vacuum suction block 3, the heating unit 9 heats the rigid substrate 4, so that the rigid substrate 4 can be more easily listed-off from the flexible display panel 5.

The separation device of the flexible display panel provided in the above embodiment is applied after performing the LLO process, to lift-off the rigid substrate and the flexible display panel bonded to each other, adapting the vacuum sucking and connection, and the power unit along the first direction forming the included angle with the normal direction to provide the rigid substrate, enables the rigid substrate to be lifted-off from the flexible display panel efficiently and stably, and also to avoid damage to the flexible display panel and the rigid substrate during the lifting-off process. In addition, the structure of the separation apparatus is simple, easy to implement, and its operation is simple, and is beneficial for large-scale industrial production.

Figure 2A:
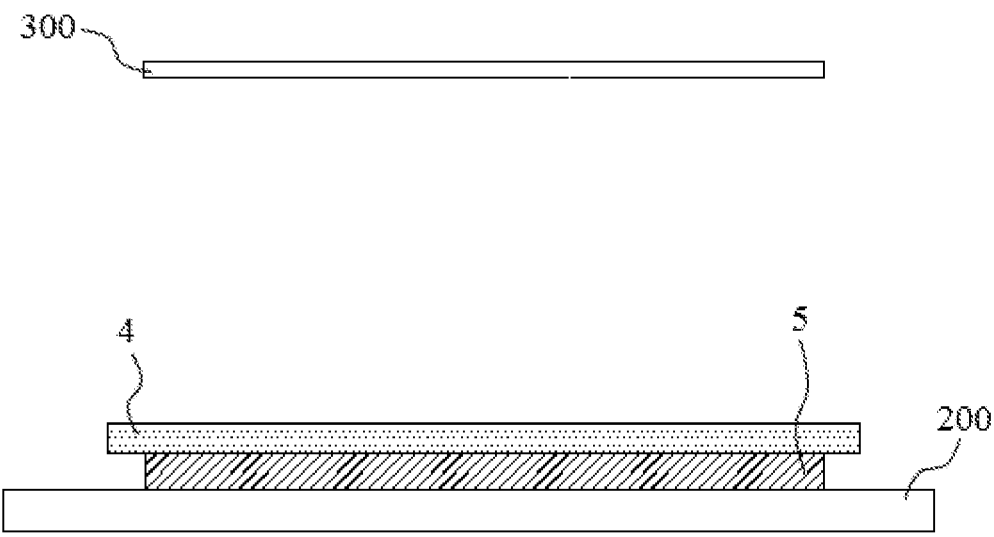
FIGS. 2a-2f are schematic diagrams corresponding to the respective process steps in the process flow of the separation method of the flexible display panel provided by the embodiment of the present invention.

Based on the same inventive concept, the present embodiment also provides a method for separating a flexible display panel, for separating a rigid substrate and a flexible display panel that are bonded to each other. The separation method will be described in detail below with reference to FIGS. 2a-2f, In particular, the separation method includes the following steps:

S1 as shown in FIG. 2a, first providing a vacuum suction platform 200, sucking and fixing the flexible display panel 5 to the vacuum suction platform 200 by placing the flexible display panel 5 toward the vacuum suction platform 200, disposing a fixed frame 300 above the vacuum suction platform 200. Specifically, after the flexible display panel 5 is fabricated on the rigid substrate 4, the flexible display panel 5 is placed toward the bearing surface of the vacuum suction platform 200, and the vacuum suction platform 200 is controlled to be evacuated, the flexible display panel 5 is sucked and fixed to the vacuum suction platform 200, in this time, the rigid substrate 4 is relatively positioned above the flexible display panel 5.

Figure 2B:
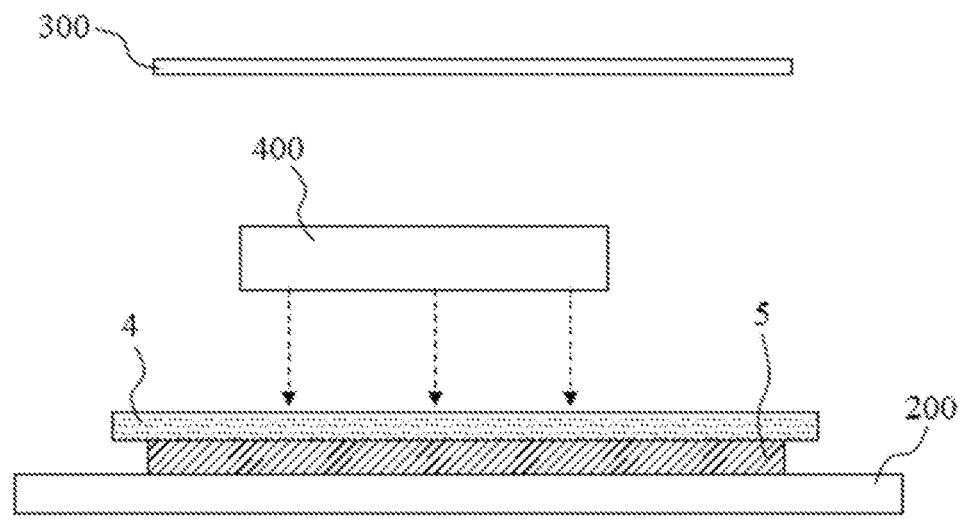

S2, as shown in FIG. 2b, by using the laser lifting-off process, ablating the adhesive layer between the flexible display panel 5 and the rigid substrate 4. Specifically, a laser lift-off device 400 is used to irradiate a laser beam (a dotted arrow in the drawing to indicate the laser beam) from the top of the rigid substrate 4 to ablate the adhesive layer between the flexible display panel 5 and the rigid substrate 4. After the adhesive layer is ablated, the flexible display panel 5 and the rigid substrate 4 are only adhering to each other, and the adhesion force between the bonding interface is much smaller than the adhesion force before the ablating of the adhesive layer.

Figure 2C:
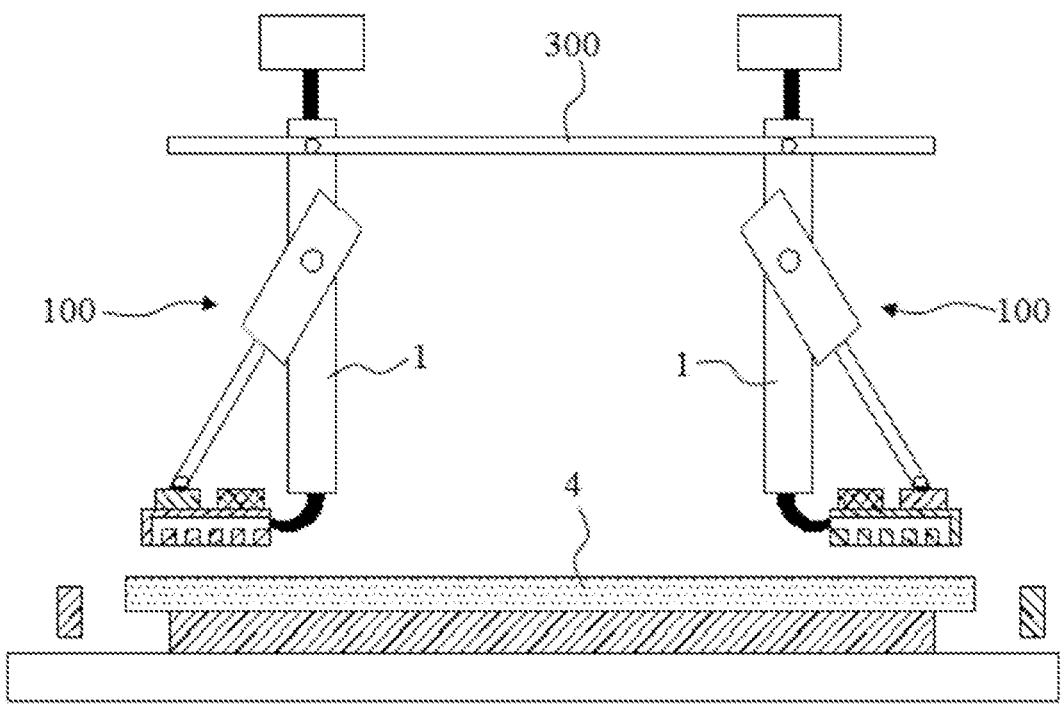

S3, as shown in FIG. 2c, the separation apparatus 100 for the flexible display panel according to the embodiment of the present invention is provided, fixing the separation apparatus 100 above the rigid substrate 4. Specifically, the separation apparatus 100 is fixedly connected to the fixing frame 300 through the supporting post 1, the supporting post 1 supports the separation apparatus 100 on the relatively upper side of the rigid substrate 4.

In the lift-off process of the present embodiment, referring to FIG. 2c, two of the separation apparatuses 100 are provided, two of the separation apparatuses 100 are respectively fixed to the fixing frame 300, respectively, and the two separation apparatuses 100 are respectively provided on the relatively two ends of the rigid substrate 4, the rigid substrate 4 need to be lifted-off from relatively two ends simultaneously. It should be noted that, in still other embodiments, the number of the separation apparatuses 100 may be set according to actual needs. For example, when the size of the rigid substrate to be separated 4 is larger, the larger number of the separation apparatuses 100 may be provided, and the rigid substrate 4 may be simultaneously lifted-off from different positions.

Further, the fixing frame 300 may be provided as a guide rail structure, the supporting post 1 is configured to be slidably connected to the fixing frame 300 and configured with a locking component. Before the separation apparatuses 100 is positioned, the position of the separation apparatuses 100 can be adjusted by sliding the supporting post 1, the supporting post 1 is connected to the position of the fixed frame 300 by the locking component to lock and fix after the position need to be fixed is determined.

Figure 2D:
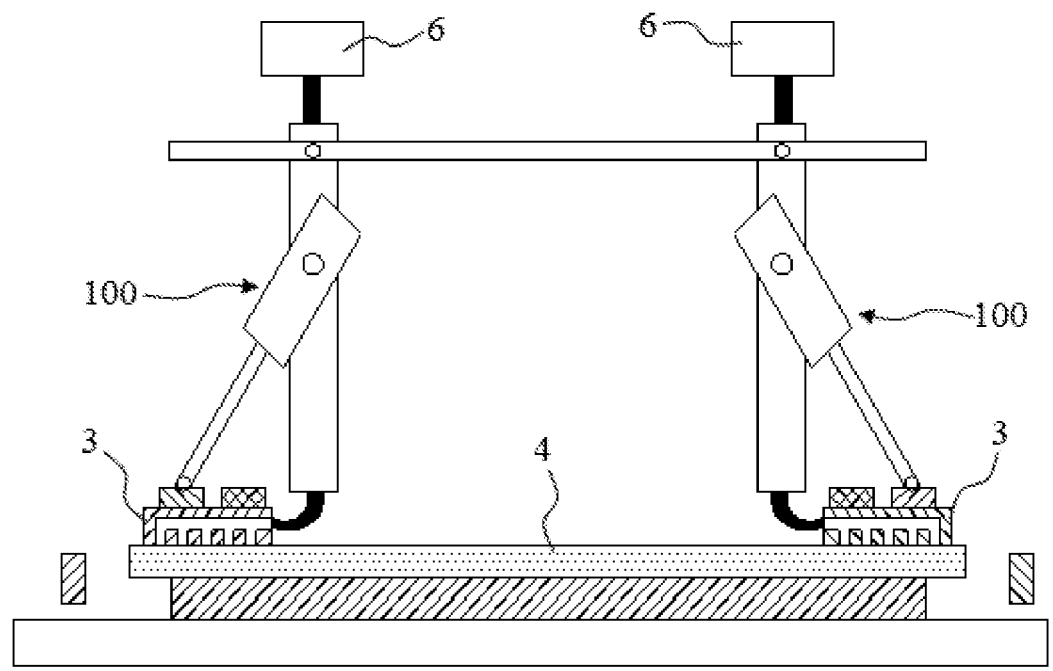

S4, as shown in FIG. 2d, controlling the vacuum suction block 3 of the separation apparatus 100 to suck and connect to the rigid substrate 4, position of the vacuum suction block 3 sucked and connected is adjacent to the edge of the rigid substrate 4. Specifically, the vacuum suction block 3 is bonded to the surface of the rigid substrate 4, and then the vacuum suction device 6 is controlled to be evacuated, so that the vacuum suction block 3 is sucked and connected to the rigid substrate 4.

Figure 2E:
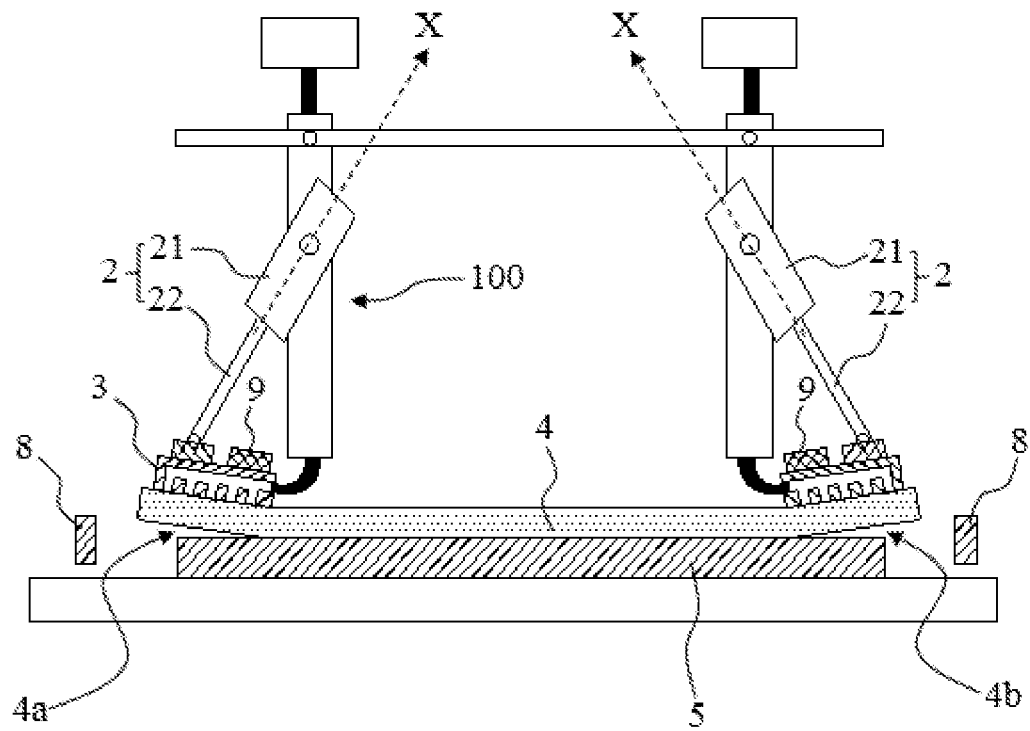

S5, as shown in FIG. 2e, controlling the power unit 2 of the separation apparatus 100 to pull the vacuum suction block 3, so that the flexible display panel 5 and the rigid substrate 4 are separated from the bonding interface to form opening portions 4a, 4b. Specifically, in the present embodiment, the drive shaft 22 is driven by the power output device 21 to pull the vacuum suction block 3 obliquely upward (along the first direction X), the edges of both sides of the rigid substrate 4 are bent and lifted, and the edges of both sides of the bonding interface between the flexible display panel 5 and the rigid substrate 4 are separated to form the opening portions 4a, 4b.

Figure 2F:
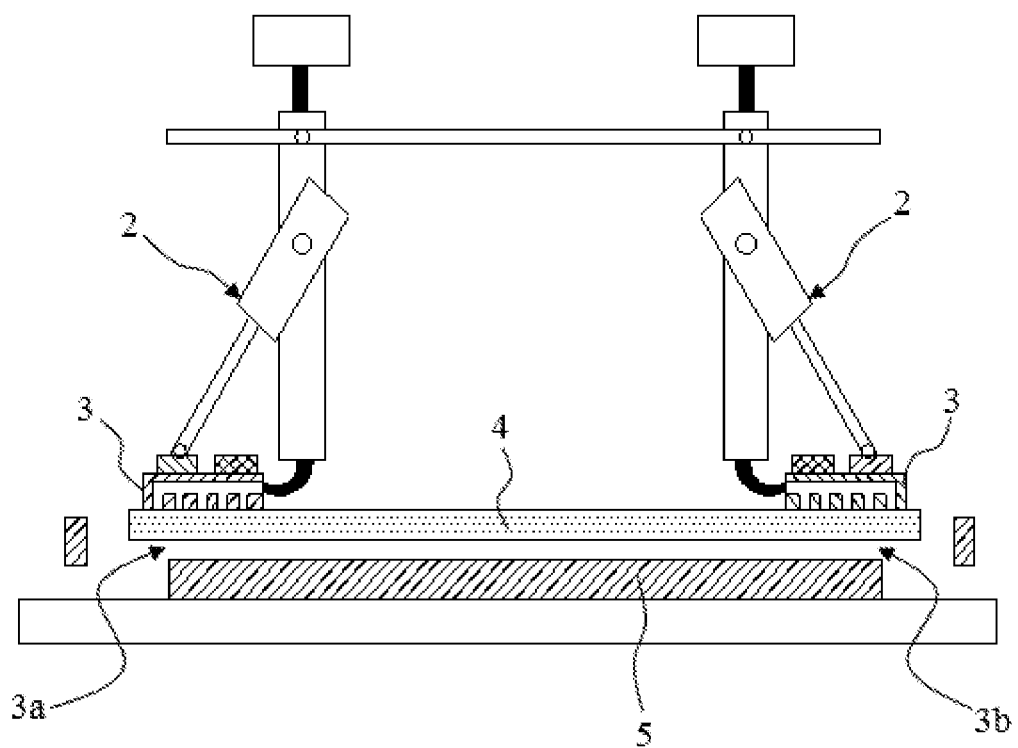

S6, referring to FIGS. 2e and 2f, controlling the power unit 2 continually to pull the vacuum suction block 3, to extend the opening portions 4a, 4b until the rigid substrate 4 completely lifted-off from the flexible display panel 5. Specifically, in the present embodiment, the drive shaft 22 is driven by the power output device 21 to pull the vacuum suction block 3 obliquely upward (along the first direction), to make the opening portions 4a, 4b extending toward the center of the bonding interface, until the opening portions 4a, 4b of both sides communicate with each other, to completely separate the rigid substrate 4 from the flexible display panel 5.

Wherein, in order to avoid the bending fracture of the rigid substrate 4 during the pulling process of the vacuum suction block 3, the speed of the power unit 2 to pull the vacuum suction block 3 along the first direction should be controlled to be slow and uniform, preferably, the moving speed is controlled to be between 0.1 and 0.3 mm/s, and the moving speed can be controlled by the power output device 21.

In the preferred embodiment, referring to FIG. 2e, the separation apparatus 100 further includes an air blowing unit 8, so that in the above separation method, after the formation of the opening portions 4a, 4b, the air blowing unit 8 blow the gas into the bonding interface between the flexible display panel 5 and the rigid substrate 4 through the opening portions 4a, 4b, whereby making a better and faster separation between the flexible display panel 5 and the rigid substrate 4.

In the preferred embodiment, referring to FIG. 2e, the separation apparatus 100 further includes a heating unit 9 connected to the vacuum suction block 3, so that in the above separation method, after the vacuum suction block 3 sucking and connecting to the rigid substrate 4, by heating the rigid substrate 4 by the heating unit 9, the rigid substrate 4 can be more easily listed-off from the flexible display panel 5, The heating of the rigid substrate 4 should avoid the heat from damaging the rigid substrate 4 and the flexible display panel 5. Therefore, the heating temperature is preferably in the range of 50° C. to 80° C.

The method for separating the flexible display panel provided by the above embodiment, by sucking and connecting the edges of the upper surface of the rigid substrate, and applying the pulling force toward the center axis direction of the rigid substrate, so that the bonding interface between the flexible display panel and the rigid substrate forms the opening portions that gradually extends inwardly. Finally, the rigid substrate is lifted-off from the flexible display panel effectively and stably, thereby improving work efficiency. During the process of separation, the contact and fixing between the separation apparatus and the rigid substrate and the flexible substrate is achieved by vacuum suction, which avoids the rigid substrate and the flexible substrate from being damaged in the separation process by using sharp tools.

It should be noted that, in this document, relational terms such as first and second are merely used to distinguish one entity or operation from another entity or operation, and do not necessarily require or imply that the entity or operation is any such actual relationship or order between.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A flexible display panel separation apparatus, for lifting-off a rigid substrate from a flexible display panel, wherein the separation apparatus comprises a support post, a power unit and a vacuum suction block;

wherein the supporting post is used to support the separation apparatus on the relatively upper side of the rigid substrate to be separated;

the vacuum suction block is in communication with the support post, and is used to suck and connect the rigid substrate to be separated; and one end of the power unit is connected to the support post, the other end is rotatably connected with the vacuum suction block, and is configured to control the vacuum suction block together with the rigid substrate to be separated from the flexible display panel;

wherein the vacuum suction block comprises a suction nozzle, the suction nozzle is connected to an external vacuum suction apparatus through an air pipe, the air pipe is extended in the support post.

2. The flexible display panel separation apparatus according to claim 1, wherein the power unit comprises a power output device and a drive shaft, the drive shaft is extending along a first direction, the power output device is drivably connected to the drive shaft to drive the drive shaft to reciprocate motion in the first direction, the vacuum suction block is rotatably connected to the drive shaft; wherein the first direction forms an included angle between a normal direction of the rigid substrate to be separated.

3. The flexible display panel separation apparatus according to claim 2, wherein the angle of the included angle is 5° to 30°.

4. The flexible display panel separation apparatus according to claim 2, wherein the power output device is a cylinder, the power output device is connected to a first end of the drive shaft, the vacuum suction block is connected to a second end of the drive shaft.

5. The flexible display panel separation apparatus according to claim 4, wherein the vacuum suction block is connected to the second end of the drive shaft by an universal joint.

6. The flexible display panel separation apparatus according to claim 1, wherein the separation apparatus further comprises:

an air blowing unit, the air blowing unit is for blowing gas into a bonding interface between the flexible display panel and the rigid substrate.

7. The flexible display panel separation apparatus according to claim 1, wherein the vacuum suction block is connected to a heating unit, the heating unit is for heating the rigid substrate through the vacuum suction block.

8. A flexible display panel separation method, for separating a rigid substrate from a flexible display panel, wherein the separation method comprises:

providing a vacuum suction platform, sucking and fixing the flexible display panel to the vacuum suction platform by placing the flexible display panel toward the vacuum suction platform;

ablating an adhesive layer between the flexible display panel and the rigid substrate by using a laser lifting-off process;

providing a separation apparatus for the flexible display panel, fixing the separation apparatus above the rigid substrate, wherein the separation apparatus comprises a support post, a power unit and a vacuum suction block, the supporting post is used to support the separation apparatus on the relatively upper side of the rigid substrate to be separated, the vacuum suction block is in communication with the support post, and is used to suck and connect the rigid substrate to be separated, and one end of the power unit is connected to the support post, the other end is rotatably connected with the vacuum suction block;

controlling the vacuum suction block of the separation apparatus to suck and connect to the rigid substrate, wherein a position of the vacuum suction block sucked and connected is adjacent to an edge of the rigid substrate;

controlling the power unit of the separation apparatus to pull the vacuum suction block, to make a bonding interface of the flexible display panel and the rigid substrate separated and forming an opening portion; and controlling the power unit continually to pull the vacuum suction block, to make the opening portion extended until the rigid substrate completely lifted-off from the flexible display panel;

wherein the vacuum suction block comprises a suction nozzle, the suction nozzle is connected to an external vacuum suction apparatus through an air pipe, the air pipe is extended in the support post.

9. The flexible display panel method according to claim 8, wherein the speed of the power unit to pull the vacuum suction block is 0.1~0.3 mm/s.

10. The flexible display panel method according to claim 8, wherein the power unit comprises a power output device and a drive shaft, the drive shaft is extending along a first direction, the power output device is drivably connected to the drive shaft to drive the drive shaft to reciprocate motion in the first direction, the vacuum suction block is rotatably connected to the drive shaft; wherein the first direction forms an included angle between a normal direction of the rigid substrate to be separated.

11. The flexible display panel method according to claim 10, wherein the angle of the included angle is 5° to 30°.

12. The flexible display panel method according to claim 10, wherein the power output device is a cylinder, the power output device is connected to a first end of the drive shaft, the vacuum suction block is connected to a second end of the drive shaft.

13. The flexible display panel method according to claim 12, wherein the vacuum suction block is connected to the second end of the drive shaft by an universal joint.

14. The flexible display panel method according to claim 8, wherein the separation apparatus further comprises:

an air blowing unit, the air blowing unit is for blowing gas into a bonding interface between the flexible display panel and the rigid substrate; and the separation method further comprising: when pulling the vacuum suction block, an air is blown into the bonding interface through the opening portion.

15. The flexible display panel method according to claim 8, wherein the vacuum suction block is connected to a heating unit, the heating unit is for heating the rigid substrate through the vacuum suction block; and the separation method further comprising: the separation method further comprising: when pulling the vacuum suction block, heating the rigid substrate through the conduction of the vacuum suction block.

16. The flexible display panel method according to claim 15, wherein a heating temperature to the vacuum suction block is 50° C. to 80° C.

* * * * *